(12) United States Patent
Miyashita et al.

(10) Patent No.: US 7,300,707 B2
(45) Date of Patent: Nov. 27, 2007

(54) ALUMINIUM COMPOSITE STRUCTURE HAVING A CHANNEL THEREIN AND METHOD OF MANUFACTURING THE SAME

(75) Inventors: Kinya Miyashita, Kanagawa (JP); Yoshiaki Tatsumi, Kanagawa (JP)

(73) Assignee: Creative Technology Corporation, Kanagawa-Ken (JP)

( * ) Notice: Subject to any disclaimer, the term of this patent is extended or adjusted under 35 U.S.C. 154(b) by 292 days.

(21) Appl. No.: 10/971,138

(22) Filed: Oct. 25, 2004

(65) Prior Publication Data

US 2006/0086475 A1    Apr. 27, 2006

(51) Int. Cl.
*B32B 3/10* (2006.01)
*B32B 3/02* (2006.01)
*B32B 3/30* (2006.01)
*B32B 1/04* (2006.01)
*B32B 1/06* (2006.01)
*B32B 15/04* (2006.01)
*B32B 15/20* (2006.01)

(52) U.S. Cl. .................. 428/628; 428/650; 428/654; 428/58; 428/137; 428/472.2; 428/689

(58) Field of Classification Search .................. None
See application file for complete search history.

(56) References Cited

U.S. PATENT DOCUMENTS

| | | | |
|---|---|---|---|
| 5,361,824 A | | 11/1994 | Keck |
| 5,646,814 A | * | 7/1997 | Shamouilian et al. ........ 361/234 |
| 5,715,312 A | * | 2/1998 | Ijtsma ........................ 714/747 |
| 5,886,863 A | * | 3/1999 | Nagasaki et al. ........... 361/234 |
| 5,904,776 A | * | 5/1999 | Donde et al. ............... 118/500 |
| 5,910,338 A | * | 6/1999 | Donde ........................ 427/290 |
| 6,263,829 B1 | * | 7/2001 | Schneider et al. ......... 118/723 I |
| 6,929,874 B2 | * | 8/2005 | Hiramatsu et al. .......... 428/698 |
| 7,033,444 B1 | * | 4/2006 | Komino et al. ............. 118/725 |
| 7,084,376 B2 | * | 8/2006 | Ito et al. .................. 219/444.1 |
| 2004/0021475 A1 | * | 2/2004 | Ito et al. ...................... 324/754 |
| 2004/0200419 A1 | * | 10/2004 | Mauck et al. ............... 118/724 |

FOREIGN PATENT DOCUMENTS

| | | |
|---|---|---|
| JP | 11-061448 A | 3/1999 |
| JP | 11-080857 A | 3/1999 |
| JP | 11-121598 A | 4/1999 |
| JP | 2001-329350 A | 11/2001 |

* cited by examiner

*Primary Examiner*—Jennifer C. McNeil
*Assistant Examiner*—Jason L. Savage
(74) *Attorney, Agent, or Firm*—Rader, Fishman & Grauer PLLC

(57) ABSTRACT

To provide an aluminium composite structure having a highly airtight channel therein, including: a core material having a concave groove on a surface; a covering material made up of aluminium or aluminium alloy which covers the surface of the core material other than an inner surface of the concave groove; and a lid which is firmly fixed to the covering material to close an opening of the concave groove of the core material, forms a channel for running a heat exchange medium therein, and is made up of the aluminium or aluminium alloy, and a method of manufacturing the same.

7 Claims, 6 Drawing Sheets

ALUMINIUM COMPOSITE STRUCTURE HAVING A CHANNEL THEREIN AND METHOD OF MANUFACTURING THE SAME

FIELD OF THE INVENTION AND RELATED ART STATEMENT

The present invention relates to an aluminium composite structure having a channel therein, which can be suitably used as a structural part for forming a chamber wall, a sample placing stage, a section of receiving ion beams or charged particles such as electrons, a Faraday cup, and the like in semiconductor manufacturing equipment, and a section where constant temperature or high temperature is required, low temperature target section, and additionally section where generally strength and homoeothermal property are both required, and a method of manufacturing the same.

At present, in various industrial fields, aluminium composite structures in which an aluminium material composed of aluminium or aluminium alloy is used as a matrix and ceramics is used as a preform are used, and particularly in recent years, have been frequently used as structural parts of semiconductor manufacturing equipment. For example, they are used for sidewalls of chambers (chamber walls) in dry etching equipment as described in JP 11-61,448 A, and used as a structural part of a substrate placing stage of substrate processing equipment where the substrates (samples) such as semiconductor substrates are processed as described in JP 11-121,598 A.

In structural parts in the above chamber wall and substrate placing stage and the like of the semiconductor manufacturing equipment, when in use, temperature control is required. Thus, inside the aluminium material which forms these structural parts, a heater for controlling the temperature of the structural part per se and a pipe and the like for running a heating medium are embedded.

Also, JP 2001-329,350 A proposes a structure including a channel structure therein in place of the heater or the pipe. This structure is, as shown in FIGS. 11(*a*) to 11(*c*), one formed to define a groove 16 at one side of a composite material 15 where ceramics powder is a reinforcing material and aluminium or aluminium alloy is a matrix, join another composite material 15 thereto, and include a channel 17 therein for running a heat exchange medium such as air and water. By running the heat exchange medium in this channel, it is possible to make the structure composed of a joint of the composite materials function as a temperature controlling jacket.

However, in the above structural parts and the structure composed of the joint of the composite materials, there are problems as described below. First, when the heater or the pipe is embedded inside the structural part, most sheath materials of the embedded heater are made of stainless, and for materials of the pipe, stainless and copper alloys are used. Thus, understandably, these materials and the aluminium material which forms the structural part are largely different in thermal expansion coefficient. Also when the heater or the pipe is embedded in the structural part, in order to avoid crushing and breaking by contact with fused aluminium at high temperature and pressure, the thick sheath and pipe must be used. This means that rigidity of the embedded one is high, and thus, it becomes a factor to produce large thermal stress between the aluminium material and the embedded one. Due to this thermal stress, peeling occurs at an interface of the heater or the pipe and the aluminium material, sometimes gaps are formed at the interface and the structural part is deformed by the thermal stress.

Meanwhile, to form the structure as described in JP 2001-329,350 A, it is necessary to conduct groove processing on the composite material, and in addition, it is necessary to perform outer shape processing, hole processing and the like. At that time, it is substantially impossible to perform a cutting process by a cutting tool such as end mill to the composite material in which hard ceramics as the reinforcing material and soft aluminium as the matrix are mixed. Therefore, it is necessary to perform a grinding process and the like using a grinding whetstone, but in the grinding process using the grinding whetstone, the aluminium material which is the matrix causes clogging of the grinding whetstone. Thus, it is necessary to process under a much gentler process condition compared to usual ceramics processing, and the whetstone must be frequently changed. Therefore, a processing cost required for the groove processing becomes extremely high.

When a joint face of the above composite material is microscopically observed, the aluminium material and the ceramics are joined in a mixed state. To make this joint face a joint face excellent in sealability, wettability for both the aluminium material and the ceramics must be obtained at temperature equal to or less than a melting point of the aluminium material, but it is technically difficult to obtain the wettability sufficiently for the ceramics in the joint at low temperature equal to or less than the melting point of the aluminium material, and it is substantially difficult to obtain the highly reliable structure excellent in airtight property. Even when they are joined at first glance, in fact, only sections of the aluminium material which is the matrix are joined, and in most cases, the wettability is not obtained in the ceramics sections, which are only in contact therewith. This problem becomes increasingly noticeable as a content of the ceramics in the composite material is increased to enhance the strength of the structure and consequently a percentage of the aluminium material present at a joint interface is reduced. Accordingly, it results in reduction of the airtight property at the joint interface.

Furthermore, the following problem may arise. In the light of surface protection and the like of the structure composed of the above composite material, it is effective to perform anodic oxide treatment, ceramics thermal spraying and the like. However, the surface of the composite material is a face where the alminium material and the ceramics are mixed when observed microscopically. Thus, when the anodic oxide treatment is given to such a face, an oxide film cannot sufficiently grow in micro-border sections between the aluminium material and the ceramics, and consequently, there is a possibility that micro-defects occur. This micro-defect becomes causes of reduction of insulation resistance as the structure and reduction of partial anti-corrosion.

When ceramics thermal spraying is given to the surface of the composite material, an adhesion between a thermal spray film and the ceramics is smaller than an adhesion between the thermal spray film and the aluminium material. Thus, the higher the content of the ceramics in the composite material is, the lower the adhesion of the thermal spray film to the surface of the composite material becomes. However, to reduce the thermal stress which is generated between the ceramics thermal spray film and the composite material, the content of the ceramics in the composite material must be increased, and it is difficult to obtain the structure including the thermal spray film having strong adhesion.

SUMMARY OF THE INVENTION

Thus, the inventors of the present invention have made extensive studies on a structure which can solve the above-mentioned problems and can be suitably used as structural parts which form chamber walls, a sample placing stage, a section of receiving ion beams or charged particles such as electrons, a Faraday cup and the like in semiconductor manufacturing equipment, and a section where constant temperature or high temperature is required, low temperature target sections, and additionally sections where generally strength and homoeothermal property are both required, and consequently have found that an aluminium composite structure having a channel therein where a core material precedently having a concave groove on its surface is covered with a covering material composed of aluminium or aluminium alloy and the channel in which a heating medium flows is formed therein by utilizing the concave groove of the core material and further closing an opening of the concave groove with a lid composed of aluminium or aluminium alloy is excellent in machinability, processing cost, strength of the structure and sealability of the channel, and have completed the present invention.

It is therefore an object of the present invention to provide an aluminium composite structure having a channel excellent in sealability inside the structure, where joint ability of members when the composite structure is formed is favorable, and which is excellent in durability.

It is another object of the present invention to provide a method of manufacturing an aluminium composite structure having a channel therein where machinability is excellent when the structure with the channel therein is formed, a channel can be easily formed into an arbitrary shape, and processing cost can be considerably reduced.

That is, the present invention provides an aluminium composite structure having a channel therein, including: a preform (core material) having a concave groove on a surface; a matrix (covering material) made up of aluminium or aluminium alloy which covers the surface of the core material other than an inner surface of the concave groove; and a lid which is firmly joined to the covering material to close an opening of the concave groove of the core material, forms a channel for running a heat exchange medium therein, and is made up of the aluminium or aluminium alloy.

Also, the present invention provides a method of manufacturing an aluminium composite structure having a channel therein, including: placing a perform (core material) having a concave groove on a surface in a die; adding a molten metal of aluminium or aluminium alloy into the die; solidifying the molten metal to prepare a composite member where the surface of the core material is covered with a matrix (covering material) made up of the aluminium or aluminium alloy; taking out the composite member from the die; removing at least a part of the covering material filled in the concave groove of the core material by machining; and firmly fixing a lid made up of the aluminium or aluminium alloy which closes an opening of the concave groove to the covering material to form a channel in which a heat exchange medium flows.

The aluminium composite structure in the present invention can be suitably used as structural parts for forming chamber walls, a sample placing stage, a section of receiving ion beams or charged particles such as electrons, a Faraday cup and the like in semiconductor manufacturing equipment, and a section where constant temperature or high temperature is required, low temperature target sections, and additionally sections where generally strength and homoeothermal property are both required. Therefore, a shape of the aluminium composite structure, a size, a thickness, and the like thereof can be freely designed in accordance with the structural parts as the above. For example, in the case of a sample placing stage on which the sample such as semiconductor wafer is placed, the structure may be formed into a disc shape, and may be formed into a quadrangular shape such as rectangle and square for use in sidewalls of a reaction chamber in semiconductor manufacturing equipment. For the channel formed inside the aluminium composite structure, depending on the equipment and a site thereof for which the structural part is used or depending on a kind of heat exchange medium which flows in the channel, a route and number thereof can be freely designed so that the desired temperature control becomes possible.

BRIEF DESCRIPTION OF THE DRAWINGS

In the accompanying drawings:

FIGS. 2 are sectional explanatory views showing a procedure for obtaining a composite member 6 which forms the aluminium composite structure X according to the present invention, in which FIG. 2(a) shows a groove core material 1, FIG. 2(b) shows the core material 1 after a concave groove 2 and core material through-holes 3 have been formed, and FIG. 2(c) shows a state where melted aluminium or aluminium alloy is placed in a die 4 in which the core material 1 is arranged;

FIGS. 4 are sectional explanatory views showing the composite member 6 and the die 4 in the present invention, in which FIG. 4(a) is a sectional explanatory view showing a dimensional relation of the die 4 and the composite member 6, and FIG. 4(b) is a sectional explanatory view showing the composite member 6 taken out from the die 4;

FIGS. 5 are sectional explanatory views showing the composite member 6 of the present invention after machining, in which FIG. 5(a) is a sectional explanatory view of a case where a covering material 5 with a given film thickness is left at each inner surface of the concave groove 2 and the core material through-holes 3 of the core material 1, and FIG. 5(b) is a sectional explanatory view of a case of machining without leaving the covering material 5 at inner surfaces of the concave groove 2 and the core material through-holes 3;

FIGS. 8 are sectional explanatory views of the aluminium composite structure X in the present invention, in which FIG. 8(a) is a sectional explanatory view of a case where a channel 10 is formed with leaving the covering material 5 with a given film thickness at the concave groove 2 of the core material 1, and FIG. 8(b) is a sectional explanatory view of a case where the channel 10 is formed without leaving the covering material 5 with a given film thickness at the concave groove 2 of the core material 1;

FIGS. 11 are sectional explanatory views illustrating a procedure for manufacturing a structure having a channel therein by prior art using FIGS. 11(a) to 11(c), in which FIG. 11(a) shows two composite materials 15, FIG. 11(b) shows an appearance where grooves 16 are formed on the one of them, and FIG. 11(c) shows a view where these composite materials 15 have been joined.

DETAILED DESCRIPTION OF THE PREFERRED EMBODIMENT

Hereinafter, preferred embodiment modes of the present invention are specifically described with reference to the accompanying drawings. Hereinafter, for example, a disc-shaped aluminium composite structure which can be used for a sample placing stage on which a semiconductor substrate is placed is illustrated, but the aluminium composite structure in the present invention is not limited to the following illustration. That is, the aluminium composite structure may be square, rectangular, quadrangular polygonal, circular, and other in planer shape so as to be used for a structural part for forming a chamber wall, a sample placing stage, a section of receiving ion beams or charged particles such as electrons, a Faraday cup, and the like in semiconductor manufacturing equipment, and a section where constant temperature or high temperature is required, low temperature target section, and additionally section where generally strength and homoeothermal property are both required. Channels which the aluminium composite structure has may be formed so as to become circular, straight linear, and the other when the aluminium composite structure is viewed in a projected plane, and the number of channels may be one or two or more.

Figure 1:
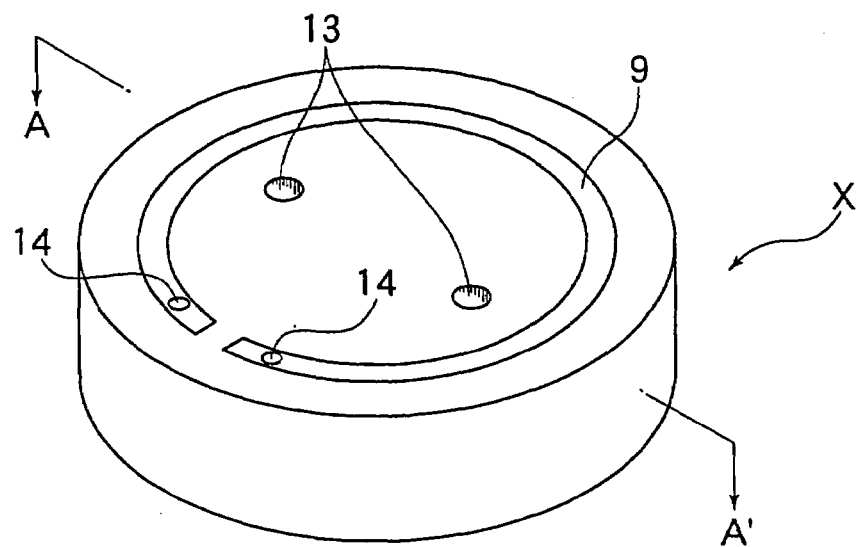
FIG. 1 is a perspective explanatory view of an aluminium composite structure X according to the present invention.

FIG. 1 is a perspective explanatory view of an aluminium composite structure X according to the present invention. For FIGS. 2 to 8, unless otherwise illustrated, the explanatory views of appearances to form the aluminium composite structure X are those when looked from a sectional direction of A-A' shown in FIG. 1.

First, a circle-like concave groove 2 as shown in FIG. 2(b) is formed on the surface of a preform (core material) 1 composed of a disc-shaped ceramics porous body shown in FIG. 2(a). The concave groove 2 is formed in a sub-circular shape on the surface of the core material 1 with a part left as shown in FIG. 3. Core material through-holes 3 which pass through the top and bottom faces of the core material 1 are installed in the core material 1, and processed into a given shape. Then, as shown in FIG. 2(c), the above core material 1 is placed in a die 4 using a spacer of carbon, boron nitride, or the like which is not shown in the figure, and molten aluminium or aluminium alloy is introduced in the die 4 by a non-pressurized infiltration method or a pressurized impregnation method so as to entirely encompass the surface of the core material 1. This molten aluminium or aluminium alloy is solidified to make a matrix (covering material) 5 which covers the surface of the core material.

In the above, it is desirable that a dimension of each part of the core material 1 be slightly smaller by a thickness of the covering material 5 from a required final processed shape of the aluminium composite structure X. The core material 1 may be formed by machining a bulk of porous ceramics, or a ceramics porous body may be obtained by machining of a precursor before sintering followed by sintering. In all cases, the processing is much easier than that in the case of performing the machining on the composite material after impregnating a matrix into a preform, which is generally performed.

As shown in FIG. 4(a), the die 4 is made to make a depth T and internal diameter R including margins for machining of the covering material 5 in regard to a thickness t and a diameter r of a required final shape dimension of the aluminium composite structure X. A composite member 6 where all surfaces (including inner surfaces of the concave groove 2 and inner surfaces of the core material through-holes 3) of the core material 1 are covered with aluminium or aluminium alloy is made by filling a molten metal of aluminium or aluminium alloy in the die 4 where the core material 1 is placed. FIG. 4(b) shows the composite member 6 taken out from the die 4. In the composite member 6, insides of the concave grooves 2 and the core material through-holes 3 of the core material 1 are filled with the covering materials 5 each composed of aluminium or aluminium alloy, and these covering materials 5 can be removed by cutting process using a common cutting tool such as an end mill. That is, the process is quite the same as that in the case where a usual aluminium material which does not include a reinforcing material and the like is processed, and thus the process is much easier and processing cost can be made much lower than those in the case where a bulk composite material including a reinforcing material such as ceramics powder is processed.

Figure 5:
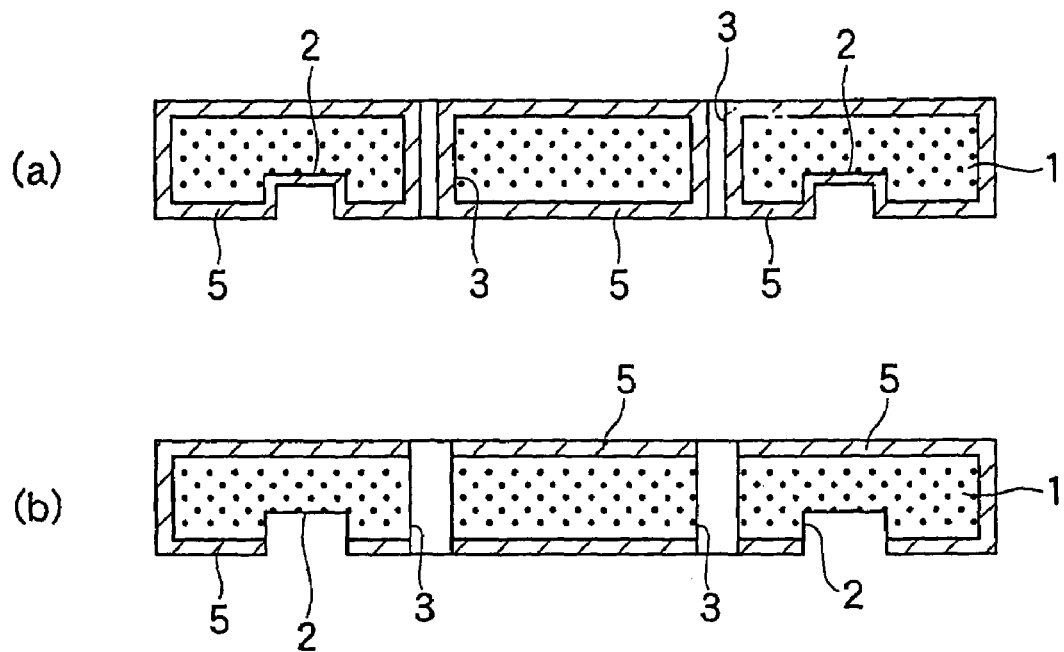

For the composite member 6 obtained above, at least a part of the covering material 5 filled in the concave groove 2 of the core material 1 is removed by machining by using a cutting tool such as an end mill. This removed section is utilized for the channel 10 later. At least a part of the covering material 5 filled in the core material through-holes 3 is removed by a drilling process using a cutting tool such as an end mill in order to form the structure through-holes 13. Furthermore, the excessive covering material 5 given on the surfaces of the composite member 6 is cut and removed in addition to the above by machining. For the machining to remove the excessive covering material 5 on the surfaces of the composite member 6, including removal of the covering material 5 filled in the concave groove 2 of the core material 1 and the drilling process for the removal of the covering material 5 in the core material through-holes 3, as described above, the same cutting process as the process of a usual aluminum material which include no reinforcing material such as ceramics powder is possible, and thus, the process is much easier and the machining cost can be reduced compared to the process of a bulk composite material which include a reinforcing material. FIGS. 5 show sectional explanatory views of the composite member 6 after processing. FIG. 5(a) is a sectional explanatory view showing the composite member 6 subjected to the machining with leaving the covering material 5 with a given film thickness on the inner surfaces including the bottom wall and sidewalls of the concave groove 2 of the core material 1 as well as with leaving the covering material 5 with a given film thickness on the inner surfaces of the core material through-holes 3. FIG. 5(b) is a sectional explanatory view of the case of machining without leaving the covering material 5 on the inner surfaces of the concave groove 2 and the inner surfaces of the core material through-holes 3. In the light of anti-deterioration of the core material 1 itself, prevention of contamination of the core material 1, or secure of sealability, it is preferable to process with leaving the covering material 5 with a given film thickness on the inner surfaces of the concave groove 2 and the core material through-holes 3 as shown in FIG. 5(*a*).

According to the above machining, it is desirable to allow the film thickness of the covering material 5 which covers on the surfaces of the core material 1 to fall within the range of 0.2 to 5 mm, and preferably 0.5 to 5 mm. When the film thickness of the covering material 5 is thinner than 0.2 mm, there is a possibility that the core material 1 is exposed at the surface owing to error of the machining. In contrast, when the film thickness is thicker than 5 mm, there is a possibility that the thermal stress between the covering material and the core material 1 becomes large owing to a thermal expansion difference to cause exfoliation at the interface due to a heat cycle. It is preferable that the film thickness be in the range of 0.5 to 5 mm in terms of durability for abrasion when a heat exchange medium is run, particularly also for the inner side covering material 5 when a channel is formed.

Figure 6:
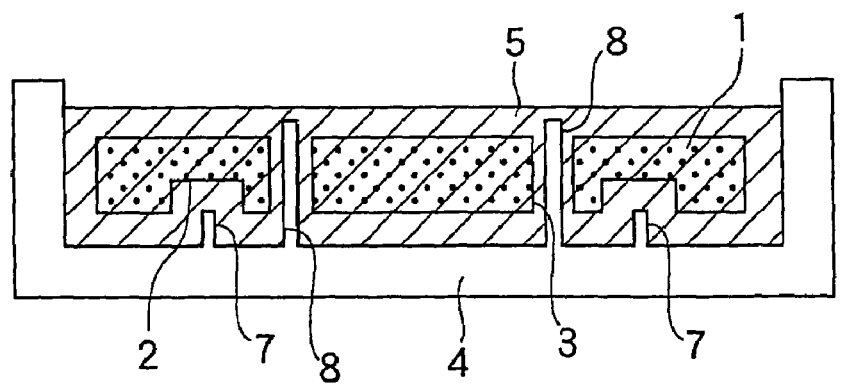
FIG. 6 is a sectional explanatory view showing a different example of the die 4 in the present invention.

For the die 4, as shown in FIG. 6, a circle-like projection 7 may be installed at a position corresponding to the concave groove 2 of the core material 1, or pole-like projections 8 inserted in the core material through-holes 3 may be installed at positions corresponding to the core material through-holes 3 of the core material 1. If the composite member 6 is formed using such a die 4, it is possible to reduce margins for machining in the machining for removal of the covering material 5 filled in the concave groove 2 of the core material 1 and the drilling process for the removal of the covering material 5 in the core material through-holes 3, and a reduction effect on the machining cost in mass production is enormous.

Figure 7:
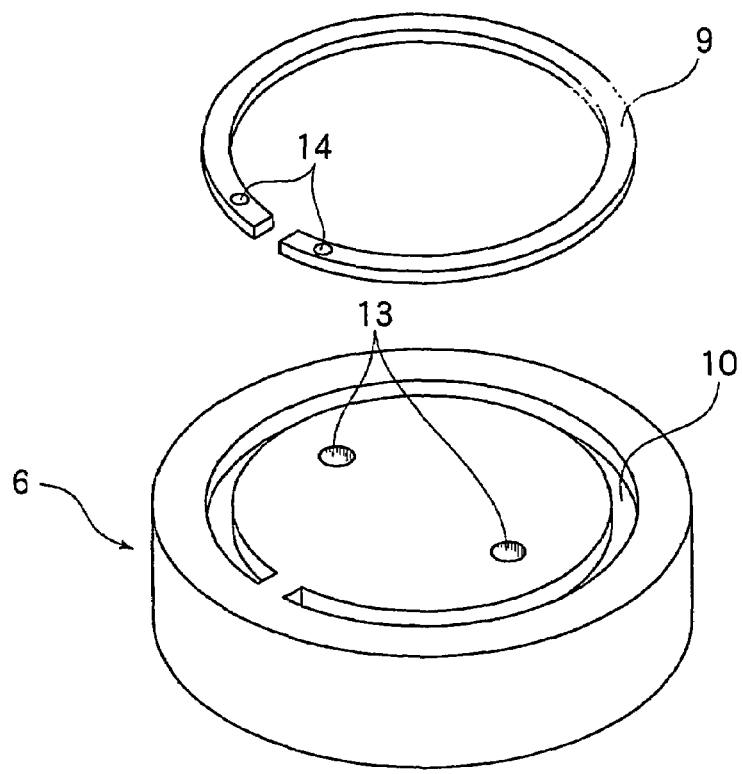
FIG. 7 is a perspective explanatory view showing an appearance of attaching a lid 9 to the composite member 6 in the present invention after the machining.
Figure 8:
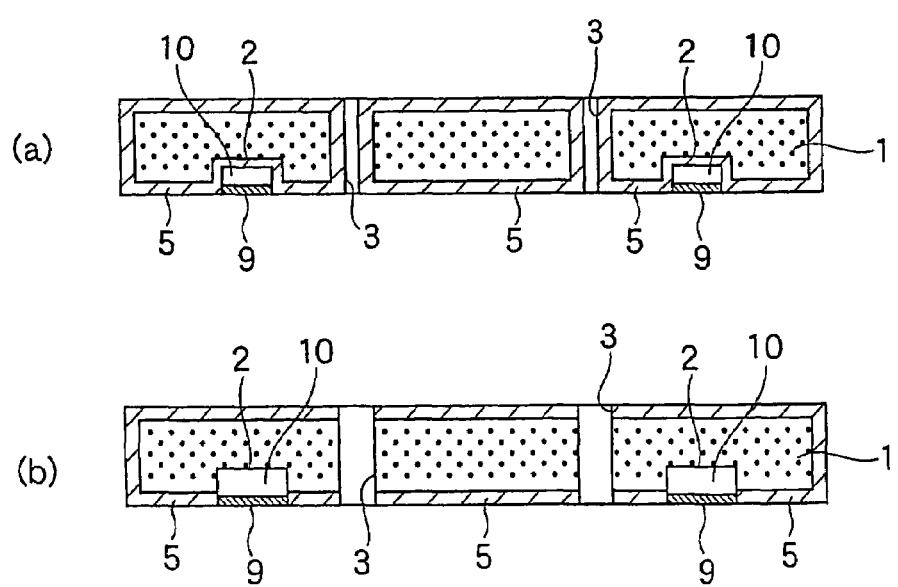

For the composite member 6 obtained above, an opening of the concave groove 2 of the core material 1 from which at least a part of the covering material 5 is removed is closed with a lid 9 composed of aluminium or aluminium alloy to complete the aluminium composite structure X. FIG. 7 shows a perspective explanatory view of an appearance where the lid 9 is fitted into the composite member 6. As shown in FIG. 7, the lid 9 closes the opening of the concave groove 2 after the removal of at least a part of the covering material 5 from the concave groove 2 of the core material 1 to have a shape capable of forming a channel 10 in which a heat exchange medium composed of a gas such as helium, argon, or nitrogen and a liquid such as hot water or cooling water is run. The lid 9 is fitted into the above opening, and the joint portions with the covering material 5 at the opening are firmly joined by electron beam welding, TIG welding, or brazing, and tightly sealed to form the channel 10 therein. At the joint interface of the lid 9 and the covering material 5 at the opening of the concave groove 2 of the core material 1, the aluminium or aluminium alloy is joined each other, and thus, it is possible to obtain high joint strength more excellent in weldability and brazing property than the joint of aluminium composite materials, where each include a reinforcing material such as ceramics powder. In consequence the aluminium composite structure X has the channel 10 excellent in sealability therein. FIGS. 8 are sectional explanatory views of the completed aluminium composite structure X. FIG. 8(*a*) is a sectional explanatory view of the aluminium composite structure X in which the channel 10 is formed by firmly joining the lid 9 to the composite member 6 with leaving the covering material 5 with a given film thickness at the bottom wall and sidewalls of the concave groove 2 of the core material 1. FIG. 8(*b*) is a sectional explanatory view of the aluminium composite structure X in which the channel 10 is formed by firmly joining the lid 9 to the composite member 6 processed without leaving the covering material 5 at the bottom wall and sidewalls of the concave groove 2 of the core material 1. For the covering material 5 in the core material through-holes 3, FIG. 8(*a*) shows the case of leaving at the given film thickness whereas FIG. 8(*b*) shows the case of not leaving the film. A combination of the presence or absence of the covering material 5 in the core material through-holes 3 with the presence or absence of the covering material 5 in the concave groove 2 is of course possible.

Figure 9:
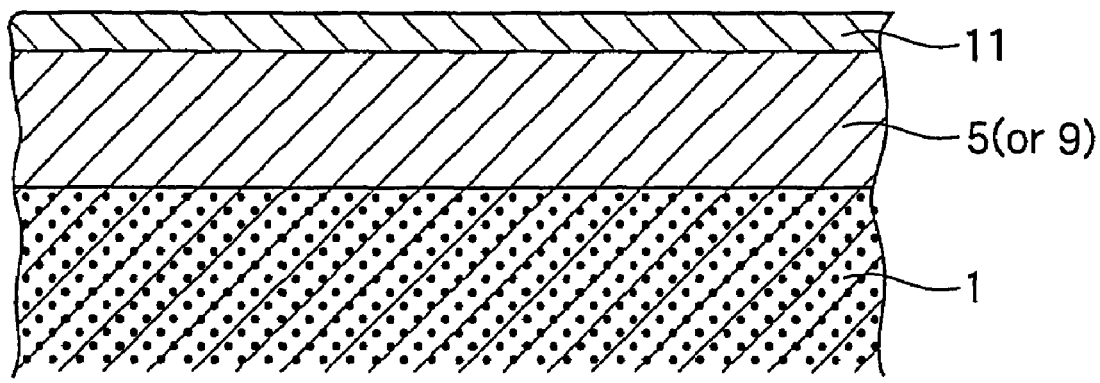
FIG. 9 is a sectional explanatory view of a case where an anodic oxide coating 11 is given on a surface of the aluminium composite structure X in the present invention.

For the above aluminium composite structure X, an anodic oxide coating 11 may be formed on the surfaces of the covering material 5 and the lid 9 which form exposed faces of the aluminium composite structure X by performing anodic oxide treatment. FIG. 9 is a sectional explanatory view illustrating a part of an interface of the anodic oxide coating 11 and the exposed face of the aluminium composite structure X. As is obvious from FIG. 9, the covering material 5 (or lid 9) which forms the exposed face of the aluminium composite structure X is composed of the aluminium or aluminium alloy, and thus, it is possible to form the uniform anodic oxide coating 11 without any defect. A film thickness of the anodic oxide coating 11 is preferably 5 to 100 µm. As a method of forming the anodic oxide coating 11, it is possible to use sulfuric acid anodic oxide treatment, oxalic acid anodic oxide treatment, mixed acid anodic oxide treatment, and the like.

Figure 10:
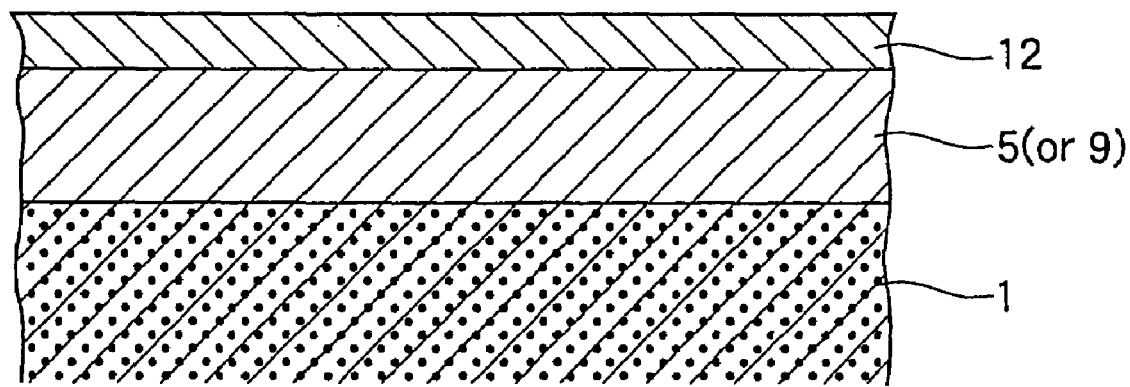
FIG. 10 is a sectional explanatory view of a case where a ceramics thermal spray film 12 is given on the surface of the aluminium composite structure X in the present invention.
Figure 11:
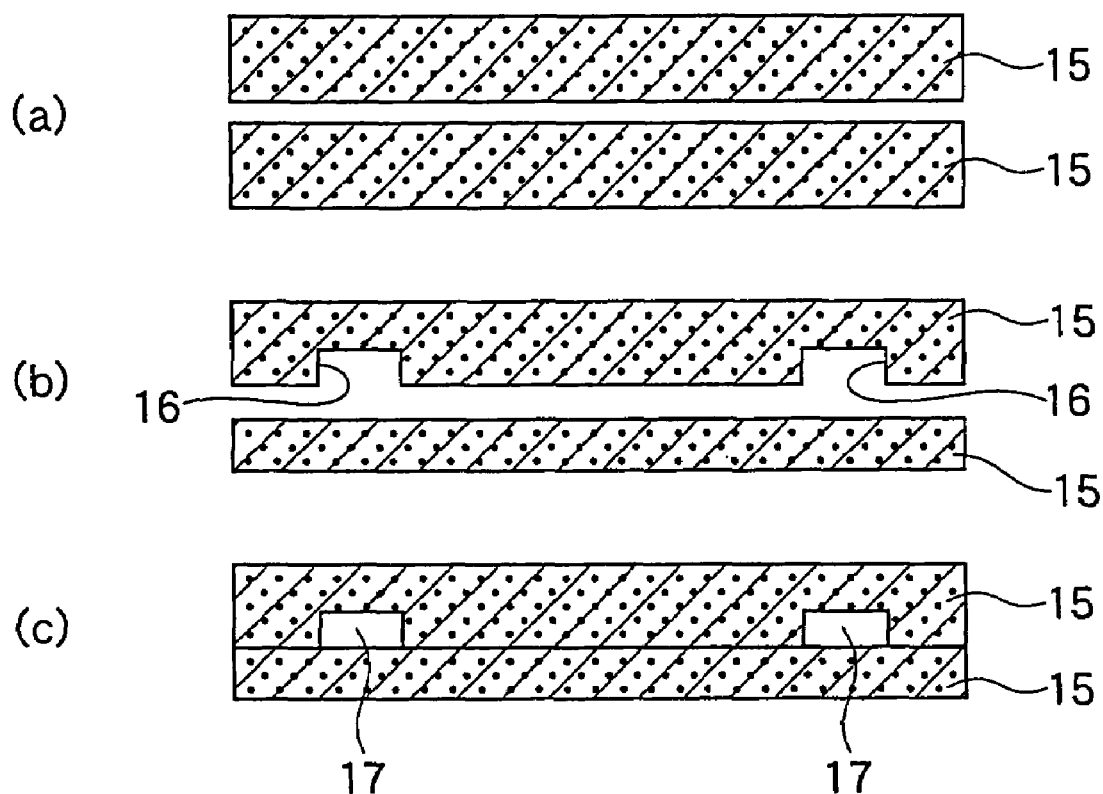

For the above aluminium composite structure X, a ceramics thermal spraying film 12 may be formed on the surfaces of the covering material 5 and a lid 9 which form the exposed faces of the aluminium composite structure X. FIG. 10 is a sectional explanatory view illustrating a part of the interface of the ceramics thermal spraying film 12 and the exposed face of the aluminium composite structure X. As is obvious from FIG. 10, the covering material 5 (or lid 9) which forms the exposed face of the aluminium composite structure X is composed of the aluminium or aluminium alloy, and thus, it is possible to form the ceramics thermal spraying film 12 with excellent adhesion on all exposed faces of the aluminium composite structure X.

When the ceramics thermal spraying film 12 is formed on the exposed face of the aluminium composite structure X, it is desirable that a film thickness of the covering material 5 be preferably 1 mm or less. When the film thickness of the covering material 5 is thicker than 1 mm, the thermal expansion coefficient of the aluminium composite structure X having the ceramics thermal spraying film 12 is dominantly affected by the aluminium or aluminium alloy, and low thermal expansion performance as the aluminium composite structure X is reduced. As a result, there is a possibility that the thermal stress between the covering material 5 and the ceramics thermal spraying film 12 becomes large. It is desirable that a film thickness of the ceramics thermal spraying film 12 be preferably 100 to 500 µm. A material of the ceramics thermal spraying film 12 can be selected from alumina, alumina nitride, mixture of alumina and titania, yttria, and the like.

EXAMPLE 1

Hereinafter, with reference to the accompanying drawings, the aluminium composite structure X according to Example of the present invention is specifically illustrated.

Figure 2:
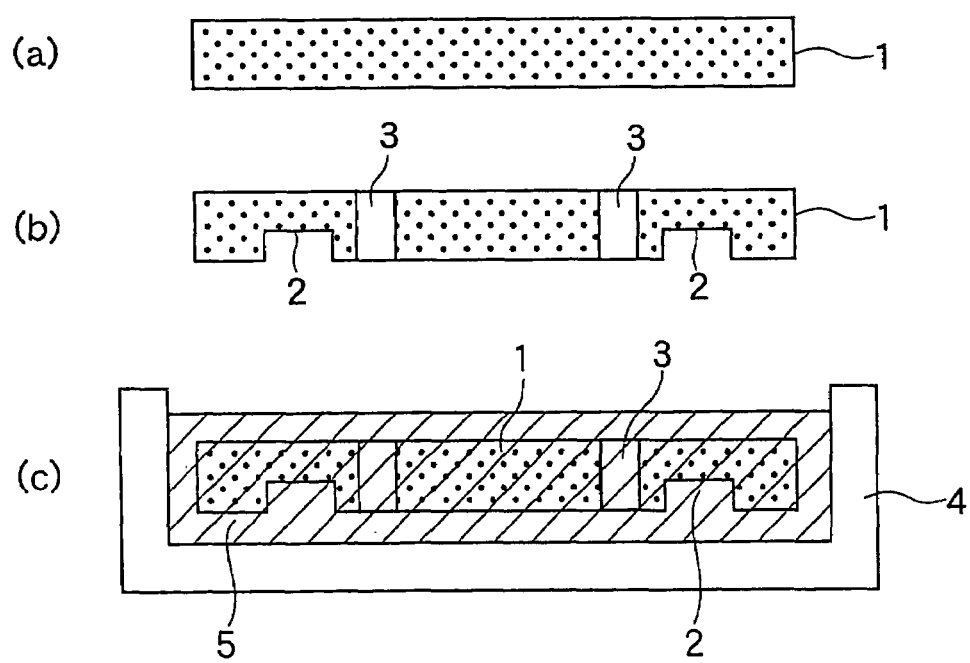
Figure 3:
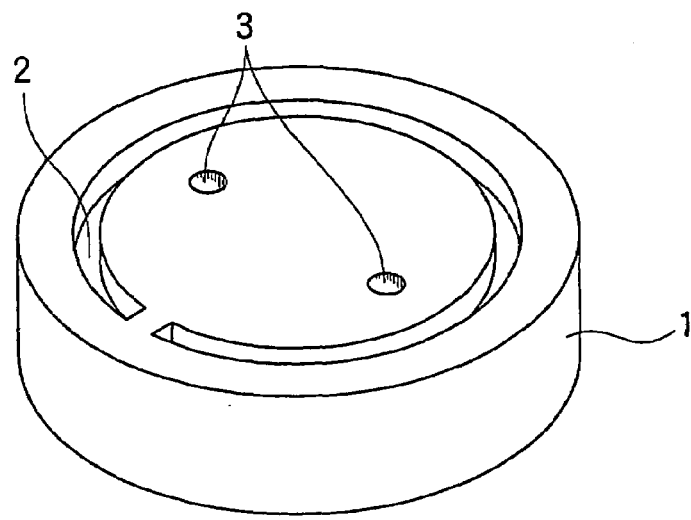
FIG. 3 is a perspective explanatory view of the core material 1 according to the present invention.
Figure 4:
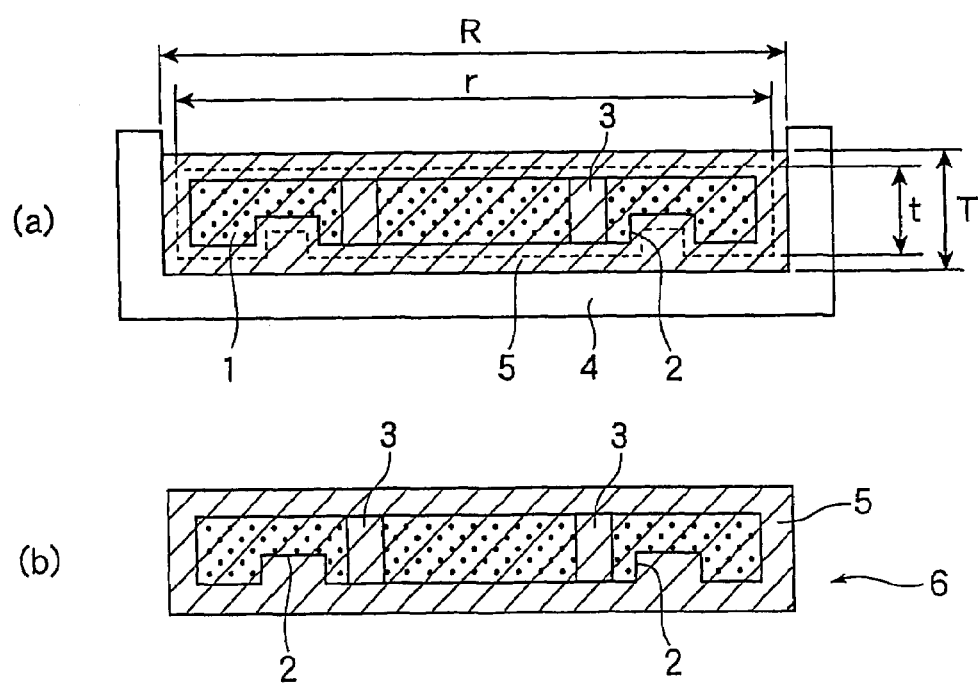

A disc-shaped ceramics porous body with a diameter of 250 mm and a thickness of 25 mm shown in FIG. 2(*a*) was used as a core material 1, and as shown in FIG. 2(*b*), a circle-like concave groove 2 measuring 20 mm in width×15 mm in depth and core material through-holes 3 with a diameter of 20 mm were formed on and in a surface of the core material 1. Then, as shown in FIG. 2(*c*), the core material 1 was placed in a die 4 with an internal diameter of 254 mm by a spacer of carbon, boron nitride or the like which is not shown in the figure, a molten metal of an aluminium alloy (A6061) was poured into the die 4, and the core material 1 was impregnated in the above molten metal of the aluminium alloy by a pressurized impregnation method. By cooling and solidifying the molten metal of aluminium alloy, a composite member 6 where the surface of the core material 1 was covered with a covering material 5 composed of the aluminium alloy was obtained. FIG. 4(*b*) shows the composite member 6 taken out from the die 4. In the composite member 6, the covering material 5 is filled in the concave groove 2 and the core material through-holes 3 of the core material 1, and all surfaces are covered with the covering material 5. In this Example, a margin for machining of the surface of the composite member 6 is 1 mm on one side, and a thickness of the covering material 5 which covers the core material 1 after machining is set to 1 mm.

The machining was given to the above composite member 6. In FIG. 7, a perspective explanatory view of the composite member 6 after completion of machining is shown. To describe this machining, first, an outer shape processing was performed by a lathe process of the composite member 6 taken out from the die 4, and the composite member 6 was processed into an outer shape dimension with a diameter of 252 mm and a thickness of 27 mm. Then, a section of the covering material 5 corresponding to the concave groove 2 of the core material 1 was processed by a milling machine to form a groove with a width of 18 mm and a depth of 15 mm which would serve as a channel 10 in which a heat exchange medium flows later. Furthermore, a drilling process was given to a section of the covering material 5 corresponding to the core material through-holes 3 of the core material 1 to form structure through-holes 13 with a diameter of 18 mm which passed through the top and bottom faces of this composite structure when the aluminium composite structure X was completed. This structure through-holes 13 are used for electrical wire guide or bolts holes or cooling gas channel in electrostatic chucking apparatuses for semiconductor device manufacturing equipment.

A lid 9 made of aluminium alloy (A1050) with a width of 18 mm and a thickness of 2 mm shown in FIG. 7 was made corresponding to a shape of an opening of the groove formed in the composite member 6 at a position corresponding to the concave groove 2 of the core member 1 to serve as the channel 10 later. The lid 9 was fitted into the above opening, and a joint portion of the covering material 5 at the opening and the lid 9 was joined and tightly sealed by electron beam welding. Connection holes 14 which are an inlet/outlet of the heat exchange medium such as gas or cooling water which is run in the channel 10 are formed at two positions. By firmly joining the lid 9 in this way, the channel 10 where the heat exchange medium was caused to flow therein was formed to complete the aluminium composite structure X.

For the completed aluminium composite structure X, sealability at a welding section was examined by air-tightly closing one of the connection holes 14 of the lid 9 and connecting a helium leak detector to another connection hole 14, and then a leak rate was 2E-10 (Torr·L/sec) and it was confirmed that very high vacuum seal was obtained.

For the purpose of forming a protective film on an exposed face of the above aluminium composite structure X, sulfuric acid anodic oxide treatment was given to the aluminium composite structure X, and the anodic oxide coating 11 with a thickness of 50 μm was formed on the entire exposed face. A film thickness of the anodic oxide coating 11 obtained by the anodic oxide treatment was 50±5 μm, and it was possible to obtain the anodic oxide coating excellent in film thickness uniformity. An insulation resistance of the anodic oxide coating 11 took a value of 50 MΩ or more with respect to a DC voltage of 1000 V, and it also exhibited an excellent property in the insulation resistance.

As illustrated in the above, according to the present invention, the aluminium or aluminium alloy which is a matrix (covering material) is impregnated in a preform (core material) to which a desired shape processing has been given by precedently defining the concave groove on the surface, and subsequently machining could be performed on the covering material which covers the surface of the core material into a final processed shape. Thus, it is possible to considerably reduce the processing cost compared to the prior art. The covering material composed of the aluminium or aluminium alloy covers the surface of the core material, and thus, joint property is much excellent when the lid composed of the aluminium or aluminium alloy is firmly fixed after machining to form the channel therein. Furthermore, in the aluminium composite structure obtained in this way, it is also possible to form the excellent coating when the surface treatment such as anodic oxide treatment or ceramics thermal spraying is performed. That is, the aluminium composite structure in the present invention is the aluminium composite structure which has the channel excellent in sealability inside the structure, is favorable in joint property of members when forming the composite structure, is excellent in durability and is highly reliable. Also, according to the method of manufacturing the aluminium composite structure in the present invention, machinability is excellent when forming the structure as the above, the channel can be easily formed into an arbitrary shape, and the processing cost can be remarkably reduced.

The aluminium composite structure in the present invention can be suitably used as structural parts for forming chamber walls, a sample placing stage, a section of receiving ion beams or charged particles such as electrons, a Faraday cup and the like in semiconductor manufacturing equipment, and a section where constant temperature or high temperature is required, low temperature target sections, and additionally sections where generally strength and homoeothermal property are both required.

What is claimed is:

1. An aluminium composite structure having a channel therein, comprising: a core material having a concave groove on a surface; a covering material which is made up of a material selected from the group consisting of aluminium and aluminium alloy and which covers the surface of the core material other than an inner surface of the concave groove; and a lid which is shaped to fit into an opening of the concave groove of the core material, and is made up of a material selected from the group consisting of aluminium and aluminium alloy, wherein the edge of said lid is firmly joined to the covering material to close and seal the opening of the concave groove of the core material and form a channel for running a heat exchange medium therein, and wherein the core material is made up of a ceramics porous body.

2. An aluminium composite structure having a channel therein according to claim 1, wherein the inner surface of the concave groove of the core material is covered with the covering material.

3. An aluminium composite structure having a channel therein according to claim 1 or 2, wherein a connection hole communicating with the channel is formed in the lid.

4. An aluminium composite structure having a channel therein according to claim 1 or 2, wherein the core material has a core material through-hole which passes through top and bottom faces, and a structure through-hole which passes through the top and bottom faces of the composite structure is formed by covering an inner surface of the core material through-hole with a covering material.

5. An aluminium composite structure having a channel therein according to claim 1 or 2, wherein a film thickness of the covering material is 0.2 to 5 mm.

6. An aluminium composite structure having a channel therein according to claim 1 or 2, wherein an anodic oxide coating with a film thickness of 5 to 100 µm is formed on surfaces of the covering material and the lid which form exposed faces of the composite structure.

7. An aluminium composite structure having a channel therein according to claim 1 or 2, wherein a ceramics thermal spraying film with a film thickness of 100 to 500 µm is formed on surfaces of the covering material and the lid which form exposed faces of the composite structure.

* * * * *